United States Patent

Kiley

[11] Patent Number: 5,908,281
[45] Date of Patent: *Jun. 1, 1999

[54] COAXIAL DRIVE LOADER ARM

[75] Inventor: Christopher Kiley, Lincoln, Mass.

[73] Assignee: Brooks Automation Inc., Chelmsford, Mass.

[*] Notice: This patent is subject to a terminal disclaimer.

[21] Appl. No.: 08/716,943

[22] Filed: Sep. 20, 1996

[51] Int. Cl.⁶ ........................ B25J 18/00
[52] U.S. Cl. ........................ 414/744.5; 74/490.04
[58] Field of Search ............... 414/744.5, 744.6, 414/744.4, 744.2, 937; 901/15, 19, 21; 74/89.2, 89.22, 490.04

[56] References Cited

U.S. PATENT DOCUMENTS

| | | | |
|---|---|---|---|
| 4,619,575 | 10/1986 | Summa et al. | 414/733 X |
| 4,687,542 | 8/1987 | Davis et al. | 156/643 |
| 4,749,330 | 6/1988 | Hine | 414/744 A |
| 4,897,015 | 1/1990 | Abbe et al. | 414/744.8 |
| 4,951,601 | 8/1990 | Maydan et al. | 118/719 |
| 5,064,340 | 11/1991 | Genov et al. | 414/744.5 |
| 5,096,364 | 3/1992 | Messer et al. | 414/744.5 |
| 5,183,370 | 2/1993 | Cruz | 414/752 X |
| 5,314,293 | 5/1994 | Carlisle et al. | 901/15 X |
| 5,333,986 | 8/1994 | Mizukami et al. | 414/217 |
| 5,431,529 | 7/1995 | Eastman et al. | 414/744.5 |
| 5,474,410 | 12/1995 | Ozawa et al. | 414/217 |
| 5,702,228 | 12/1997 | Tamai et al. | 414/744.5 |

FOREIGN PATENT DOCUMENTS

| | | |
|---|---|---|
| 1-64232 | 3/1989 | Japan . |
| 1-157547 | 6/1989 | Japan . |

*Primary Examiner*—Donald W. Underwood
*Attorney, Agent, or Firm*—Perman & Green, LLP

[57] ABSTRACT

An transfer device for moving substrates from one position to another comprises a base and a drive arm pivotally connected to one another about a first pivot axis. A drive is connected to the drive arm for moving the drive arm through an arc about the first pivot axis. The drive arm has a free end which has a second pivot axis disposed parallel to the first pivot axis. The drive arm free end further including at least one article handling element which is rotatably disposed about the second pivot axis. A belt rotatably couples the at least one article handling element to the base such that upon movement of the drive arm through the arc in a first rotary direction the at least one article handling element is rotated in the other opposite direction to move a substrate along a straight line path.

2 Claims, 8 Drawing Sheets

COAXIAL DRIVE LOADER ARM

FIELD OF INVENTION

The apparatus of the present invention relates generally to material transfer devices. The material transferred might include, but not be limited to, semiconductor wafers, such as Silicon and Gallium Arsenide, semiconductor packaging substrates, such as High Density Interconnects, semiconductor manufacturing process imaging plates, such as masks or reticles, and large area display panels, such as Active Matrix LCD substrates.

BACKGROUND OF THE INVENTION

The present invention relates generally to material transfer devices, and in particular, to an articulated arm which is coaxially driven in to effect rotation and vertical movement of substrate holders used in material transfer devices used in the production of substrates which may take the form of semi-conductor wafers and or flat panels, or other substrates, or media.

The need for high throughput transport devices which can move a substrate or workpiece between remote locations within highly confined areas as defined by a limited footprint such as found in the manufacture of wafers or panels used in the semiconductor industry are in high demand. This is because in the process of manufacturing, not just in the semiconductor industry, the need to move a workpiece from one position to the next not only requires a high throughput rate, but also accuracy of repeatability of placement of workpieces in registration at predetermined orientations on a support surface. Still a further constraint is to fabricate a positioning machine which is capable of working in a clean room environment where the existence of particulates is minimized, if not nonexistent.

Attempts have been made to fabricate placement devices which employ rotary to linear motion robotic arms which can effect straight line movement of a substrate between stations. One such arm is disclosed in U.S. Pat. No. 4,897,015. In this patent, it is disclosed to provide an end effector which is capable of carrying a substrate such as a silicon wafer from one point to another in a straight line. This is accomplished by using a series of pulleys which drivingly connect two pivot linkages about which the articulated parts travel. The dual pulley system however introduces unwanted possibilities of error by having two nonpositively connected drives control movement of the end effector, each of which drives presents a separate possibility of error through the introduction of possible belt/pulley slippage. In the device disclosed in U.S. Pat. No. 4,897,015 the slippage problem is of a furthermore problematic because of the small width belts which are used to articulate the drive mechanism.

In copending U.S. patent application Ser. No. 08/679,845, filed on Jul. 15, 1996 and entitled BATCH LOADER ARM, there is disclosed an articulated arm which is driven between extended and retracted positions through the use of a rotary drive which is laterally offset from the Z-axis drive. While such a system has been successful, there are applications where it is more desirable to drive the articulate arm at the Z-axis thereby consolidating theta and Z-axis movements in a single drive.

Accordingly it is an object of the present invention to provide an article transfer mechanism for moving an article between first and second stations in a straight linear path with repeatability of movement and which mechanism is articulated by a drive which both rotates and vertically moves the mechanism about and along a given axis.

It is still a further object of the invention to provide a transport device of the aforementioned type wherein a substrate is capable of being moved as a group of stacked substrates from one position to the next or to effect greater throughput of the processing operation.

It is yet a further object of the invention to provide a transport mechanism of the aforementioned type wherein the mechanism provides a holder on which is stacked a plurality of substrates which are handled as a group and worked on by subsequent operations using the holder.

Still a further object of the invention is to provide a transport mechanism which is capable of functioning in a clean room environment.

Further objects and advantages of the present invention will become apparent from the following specification and appended claims.

BRIEF DESCRIPTION OF THE DRAWINGS

FIG. 7 is sectional view taken along line 7—7 in FIG. 6a.

SUMMARY OF THE INVENTION

A transfer device for moving substrates from one position to another comprises a base and a drive arm pivotally connected to one another about a first pivot axis. A drive is connected to the drive arm for moving the drive arm through an arc about the first pivot axis. The drive arm has a free end which has a second pivot axis disposed parallel to the first pivot axis. The drive arm free end further including at least one article handling element which is rotatably disposed about the second pivot axis. A means rotatably couples the at least one article handling element to the base such that upon movement of the drive arm through the arc in a first rotary direction the at least one article handling element is rotated in the other opposite direction to move a substrate along a straight line path.

DETAILED DESCRIPTION OF THE PREFERRED EMBODIMENTS

Figure 1:
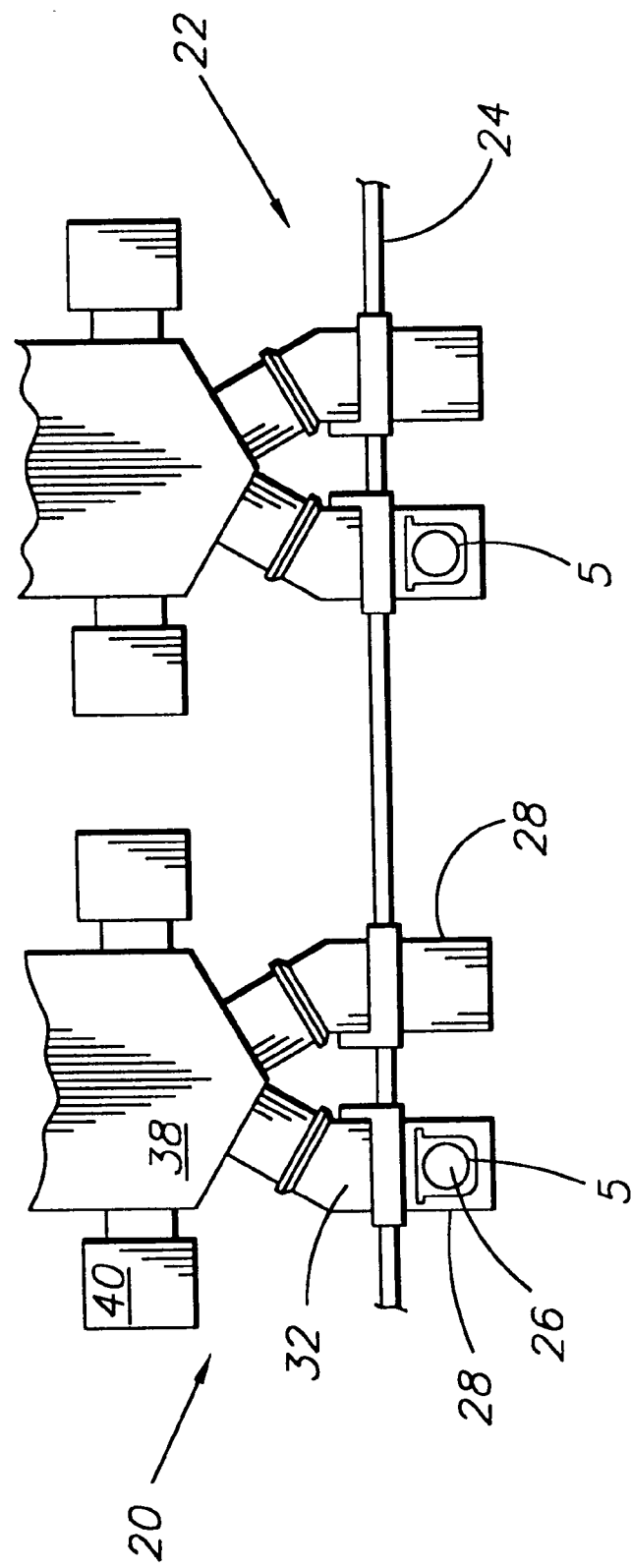
FIG. 1 is a partially fragmentary top plan diagrammatic view of a pair of side by side processing stations of the type capable of utilizing the transfer apparatus of the invention.

Turning now to the drawings, FIG. 1 illustrates a series of processing systems 20 for operating on planar substrates which may include wafers and flat panels. As noted earlier, the terms "wafer", or "substrate" will be used for purposes of consistency to refer to such substrates, but it will be understood that it is intended to be used in the broad context so as to be applicable to all substrates. The processing systems 20 may be arranged, for example, in side-by-side fashion within a "clean room" 22 separated from the outside environment by a wall 24. It may be possible to eliminate the clean room as a separate environment and, instead, maintain a desired clean environment within the system 20 and within each instrumentality which interfaces with the system In any case, it is customary to carry a large number of substrates or workpieces S (FIG. 2) within a cassette 26 or within a controlled environment carrier box 26'. In such instances, a plurality of the substrates are loaded into the cassette 26 or into the carrier box 26' where each is supported in a spaced, stacked, relationship, and then transported manually, or otherwise, and placed on a shelf 28 adjacent an associated system 20 to await entry for processing. The cassette is placed into a waiting chamber 30 within a load lock 32 when an entry door 34 (FIGS. 3 and 4) is opened enabling access through a load port 35 (FIG. 4). By means of a transfer device 36 which is positioned above the chamber base plate 31 and is articulated by a controller to be described, a plurality of the substrates S in the cassette 26 or in the controlled environment box 26' are lifted off the shelves of the cassette or box and moved in stacked form into the chamber 30 of the load lock station 32 in one motion of the device 36. Subsequently, by means of a transport apparatus 37 disposed within a transport chamber 38 connected to the load lock 32, the substrates S are moved one by one to the transport chamber 38 and, from there, to one or more of a plurality of processing stations 40.

Figure 2:
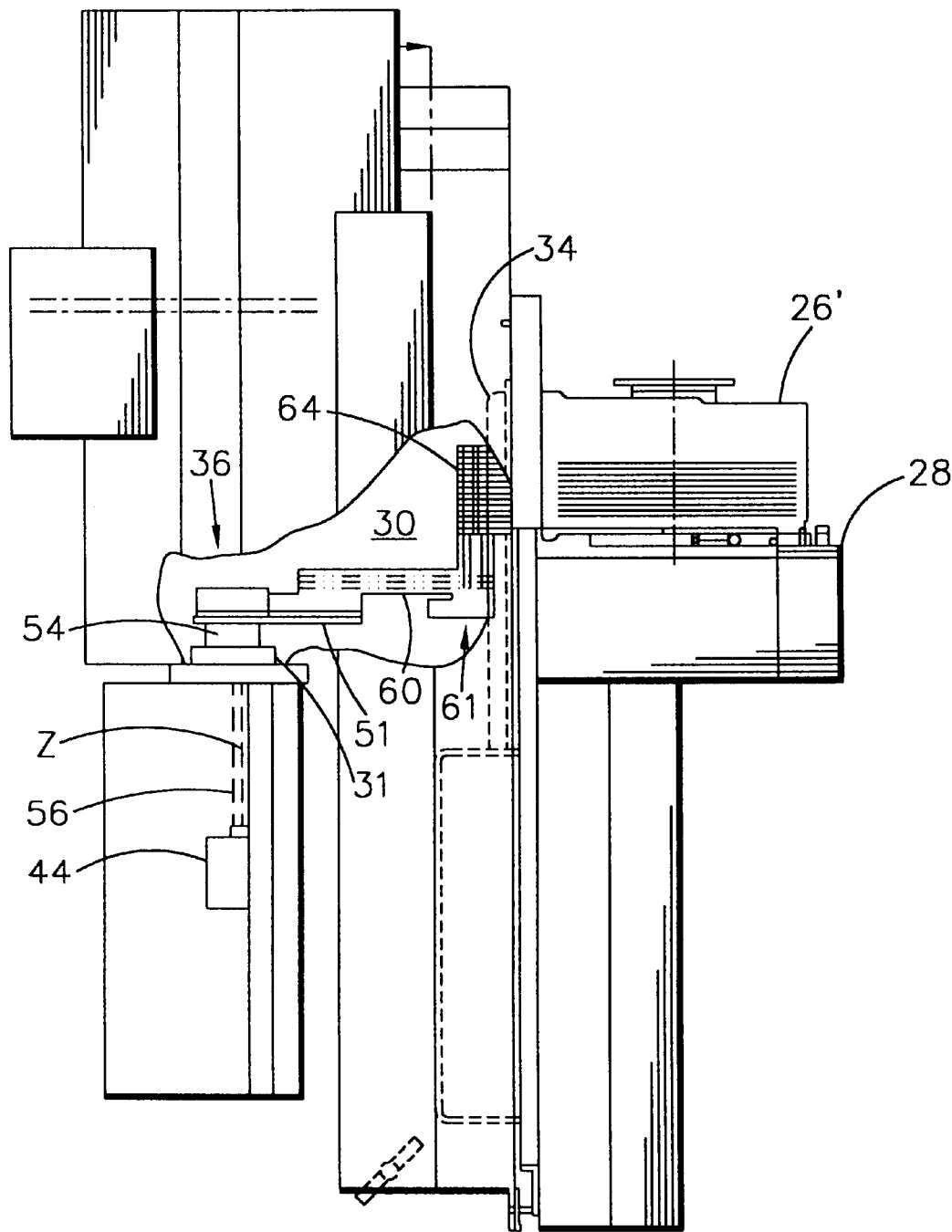
FIG. 2 is a side elevation view of the processing station illustrated in FIG. 2.

As illustrated in FIGS. 2 and 4, the transfer device 36 is mounted to the top of an elevator mechanism 44 for vertical movement along the indicated Z-axis. The elevator mechanism 44 has a housing 43 and a mount 45 supported within the load lock 32 and controllably, selectively positions the device 36 at different height locations for the purpose of positioning each substrate S for engagement with the transport apparatus 37. For this purpose, as seen in FIG. 4, the elevator mechanism 44 includes a lifting shaft 56 which is drivingly connected to a lift tube 54 responsible for moving the shaft 56 in the vertical direction along the Z-axis. At the top of the lifting tube 54 is disposed a mounting block 51 which is secured against movement to the tube 54 by an appropriate set of screws. The transfer device 36 includes an articulated drive arm 60 pivotally connected to the mounting block 51 for rotation about the indicted axis AX. The free end 61 of the drive arm 60 in turn supports a plurality 64 of end effectors 66 thereon which are arranged in a stacked arrangement and for rotational movement about the indicated axis MX. The drive arm 60 and the end effector plurality 64 are moveable both angularly and linearly relative to the support arm 52 in order to move a stack of substrates S between the cassette support station and the chamber 30 of the load lock.

The transport apparatus 37 includes substrate holders 33,33 which are controllably moved by instructions from the controller into and out of the load lock chambers 30,30 in order to pick up a substrate S supported on an end effector 66 within a chamber 30 and move it to one of the processing modules for processing and to thereafter place the worked on substrate back into the chamber where it is supported on one of the end effectors 66.

As illustrated, the radius R defines the stroke length of the substrate holder 33 from the transport chamber center TC which is standard. Each substrate holder 33 is complimentarily configured to mate with the shape of the end effectors 66 when moved along the radius R so as to lift a substrate S off the involved end effector when relative vertical movement therebetween is effected by the vertical actuator 44. Thus, by angularly orienting the end effectors 66 in line with the radius R within the load lock 32, pick and place transport of the substrate S through relative vertical movement of the end effectors and the substrate holder can be achieved.

Figure 3:
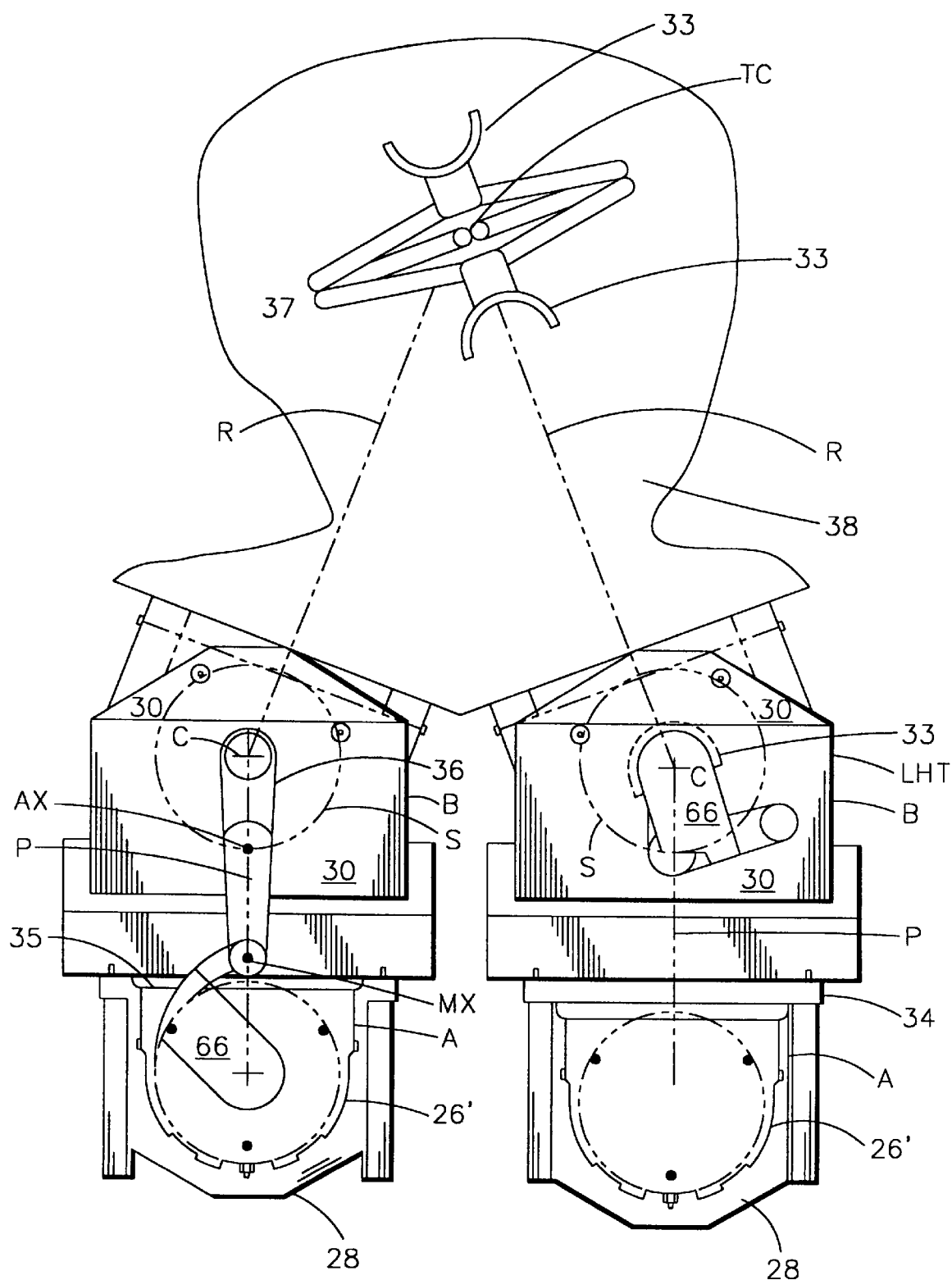
FIG. 3 is a top plan partially fragmentary diagrammatic view illustrating, in greater detail, a single one of the processing stations of FIG. 1 and utilizing a transfer apparatus embodying the invention.
Figure 4:
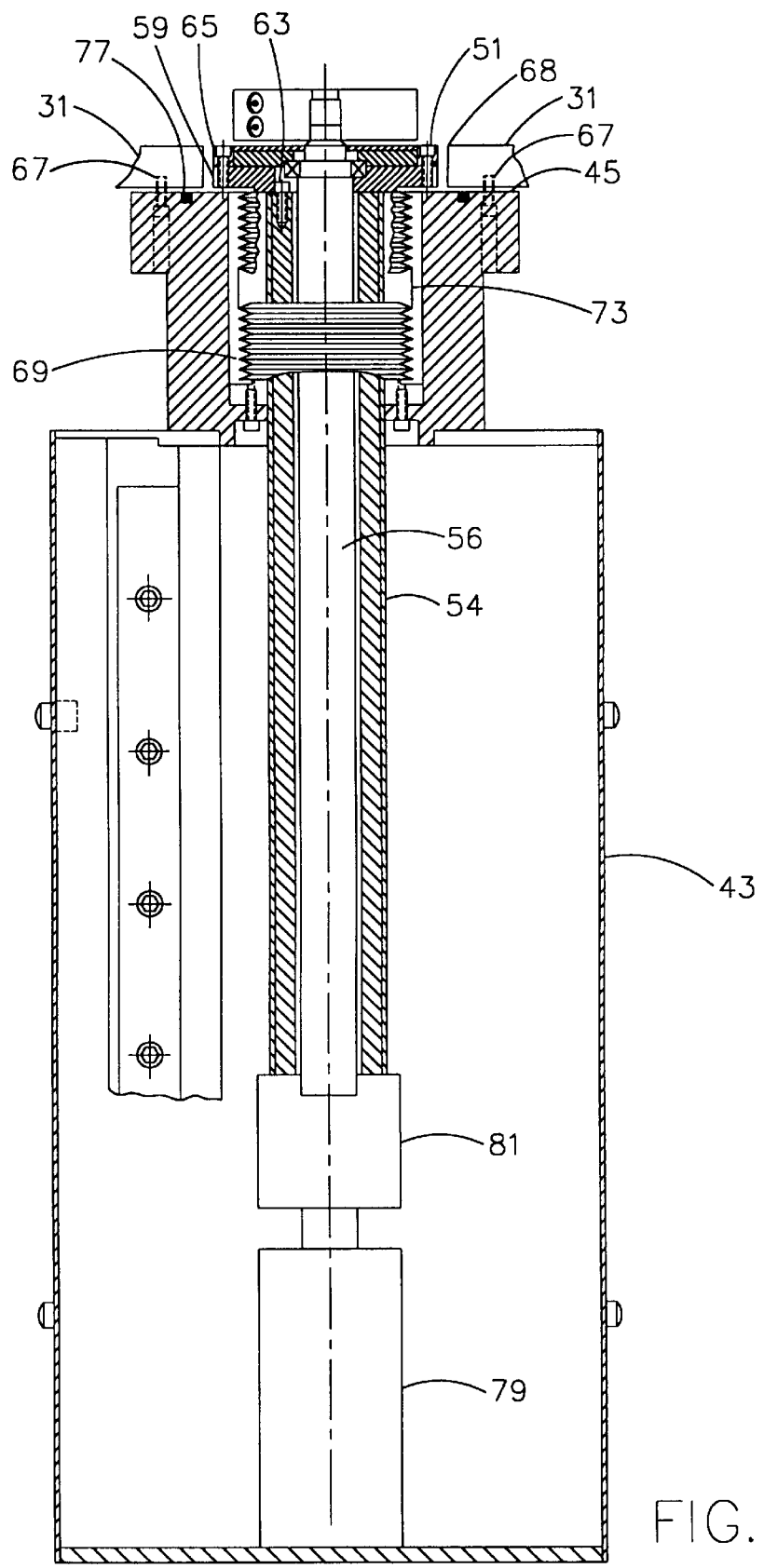
FIG. 4 is a side vertical section elevation view, certain parts being cut away for clarity, of the coaxial drive.

The transfer device 36 is capable of moving the center(s) C of the plurality of stacked substrates S (or even a single substrate) along a straight linear path as illustrated by the dashed line P extending between positions A–C in FIG. 3. The positions A and C are respectively associated with a cassette load and unload position (location A) and a transport chamber load and unload position (location B). Thus, the linear straight line P identifies the path followed by the substrate S as between the cassette 26 and the internal confines 30 of the locking station 32.

As illustrated in FIG. 4, the lift tube 54 has a collar plate 59 secured to the upper end thereof through the intermediary of set screws 63. The mounting plate 51 is secured to the end of the lift tube 54 through the intermediary of the collar plate which is connected to the mounting plate by screws 65. The mount 45 connects to the chamber base plate 31 with threaded bolts 67 which are received within threaded openings formed in the bottom surface of the plate 31. The mount 45 also includes a well 69 through which the lift tube passes. Connected to the collar plate 59 and to the bottom of the well 69, is a bellows seal 73 which is capable of axially expanding with the vertical movement of the lift tube to maintain a sealed environment within the chamber 30. An opening 68 is formed in the base plate 31 and is of a diameter sufficient to permit passage of the bellows seal 73 and the coupled lift tube therethrough. Surrounding the opening 68 radially outwardly thereof is an annular seal 77 which is received within an annular groove formed in the face of the mount 45 which confronts the undersurface of the base plate 31.

As illustrated schematically in FIG. 4, both the lifting tube 54 and the rotary shaft 56 are moved vertically through the intermediary of a vertical actuator 79. A rotary actuator 81 is drivingly coupled to the rotary shaft 56 of the transfer device 36 and further is coupled to the vertical actuator 79 such that both the lift tube 54 and the rotary shaft 56 are moved as one member vertically in response to the energization and reverse energization of the vertical actuator 79.

Figure 5:
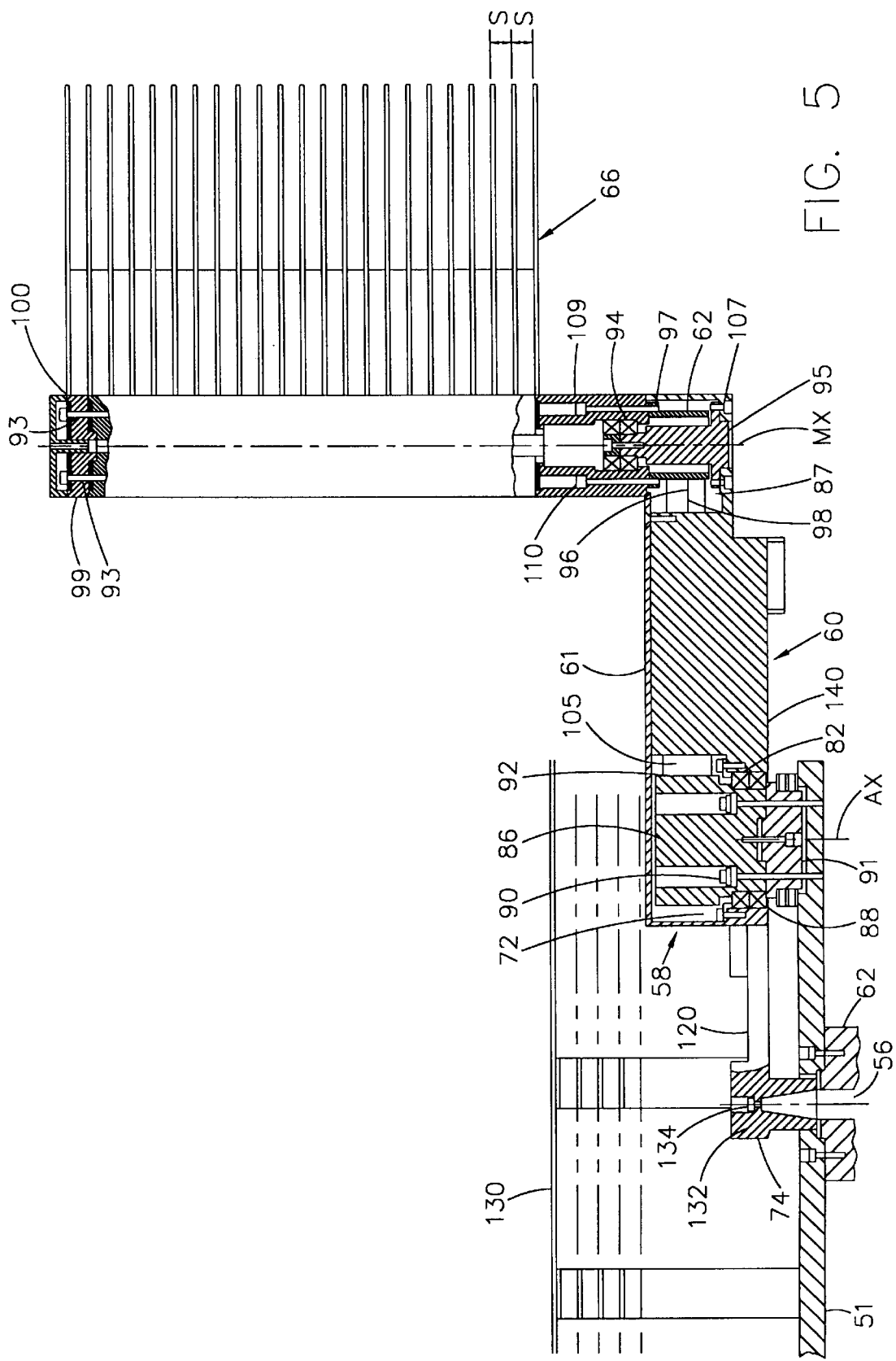
FIG. 5 is a partially fragmentary vertical sectional view through the transfer apparatus of the invention.

The mounting block 51 in the illustrated manner shown in FIG. 5 rotatably supports the drive arm 60 thereon for rotation about the indicted axis AX. The free end 61 of the drive arm 60 in turn supports a plurality 64 of end effectors 66 thereon which are arranged in a stacked arrangement and for rotational movement about the indicated axis MX. Unlike the drive arm 60, the mounting block 51 is stationary except for movement in the Z-axis. The drive arm 60 and the end effector plurality 64 are however moveable both angularly and linearly relative to the block 51.

Figure 6A:
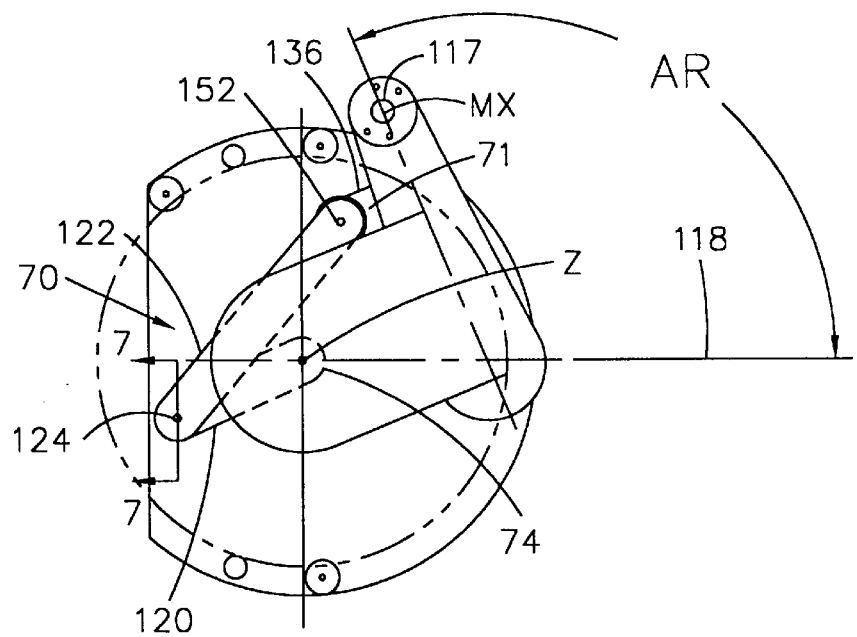
FIG. 6a is a top plan view of the linkage shown retracted.
Figure 6B:
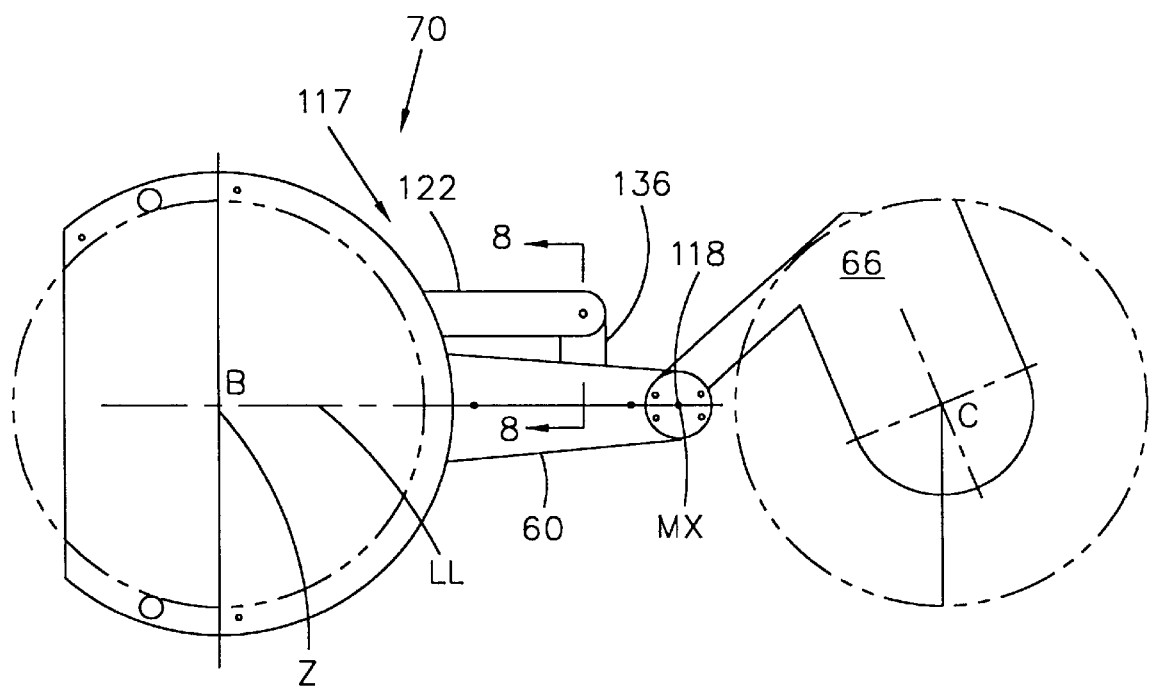
FIG. 6b is a top plan view of the linkage shown extended.

Relative movement between the drive arm 60 and the end effector plurality 64, and between these elements taken relative to the mounting block 51 is accomplished through the intermediary of an articulated linkage illustrated generally schematically at 70 in FIGS. 6a and 6b. One end of the linkage is secured to the drive arm 60 at point 71 and the other end of the linkage 70 is nonrotatably connected to the top end of the rotary shaft 56 at point 74.

As seen in FIG. 5, provided at the one end 58 of the drive arm 60 is a cylindrical opening 82 into which is received a journalling assembly 72 for effecting pivoting of the drive arm 60 relative to the mounting block 51. The assembly 72 includes a boss 86 which is concentrically disposed about the axis AX and is nonrotatably mounted to the mounting plate 51 through the intermediary of locking screws 90 which thread into receiving openings formed in the mounting block 51. A spacing element 91 is also provided and is used to elevate the boss 86 to a working position above the mounting block 51. The spacing element 91 includes openings for the locking screws 90 at positions corresponding to the locations of the receiving openings in the mounting block 51.

Disposed radially circumferentially within the opening 82 and between the boss 86 and the mounting block 51 is an annular race bearing assembly 88 which permits free rotation of the arm 60 relative to the block 51. Thus, the drive arm 60 is mounted for rotation on the boss 86 and about the axis AX such that the free end 61 thereof moves through the arc AR shown in FIG. 6a.

The boss 86 also defines a smooth surface cylindrical primary pulley 92 at the upper end thereof. The outer surface of the pulley 92 is concentrically oriented about the rotational axis AX. The opening 82 in the drive arm 60 is stepped to provide an annular gap 105 between the outer surface of the primary pulley 92 and the inner confronting wall of the cylindrical opening 82. As will become apparent the gap 105 prevents frictional interference between these two relatively pivoting parts.

At the free end 61 of the drive arm 60 is provided a cylindrical opening 87 extending parallel to the opening 82 at the other end of the arm Within the opening 87 is journalled a mounting shaft 62 which is supported thereby and is disposed for rotational movement about the indicated axis MX. The mounting shaft 62 is journalled by a bearing assembly 94 which is in turn mounted about a stepped locating post 95 disposed concentrically within the opening 87 and secured by screws 107 to the free end of the drive arm 60. Journalled for rotation about the bearing assembly 94 and aligned with a radially extending flange 97 extending from the mounting shaft 62 is a cylindrical mounting part 109 which is rotatably connected to the mounting shaft 62 by connecting screws 110. The mounting part 109 provides a platform onto which are secured the end effectors in a uniformed spaced arrangement.

The outer wall of the mounting shaft 62 is defined a smooth surface cylindrical second pulley 96 which responds to arcuate movements made by the drive arm 60. The pulleys 92 and 96 are drivingly coupled to one another through the intermediary of a thin sheet metal band 98 having a width WD which almost completely covers the effective surfaces of the 92 and 96. As will be discussed later in greater detail, it should be understood that the diameter of the primary pulley 92 is twice that of the second pulley 96.

Each end effector is spaced from the other successively ordered one by an end block 99 so as to form a stacked arrangement thereof as defined by spacings S,S. Each end effector 66 and end block 99 further has two matching pairs of openings 100,100 which are aligned with like openings in the juxtaposed ones of the neighboring end effectors and are adapted to receive elongated rods 93,93 anchored by press fitting it into the mounting part 109. Each rod 93,93 each upper end thereof is threaded and secured by a locking nut in the illustrated manner. It is noted that the spacings S,S are sufficient to permit a substrate S to be received within the spacing between juxtaposed end effectors 66 while also allowing a tool, such as the substrate holder 33, to be slid therebetween.

Figure 10:
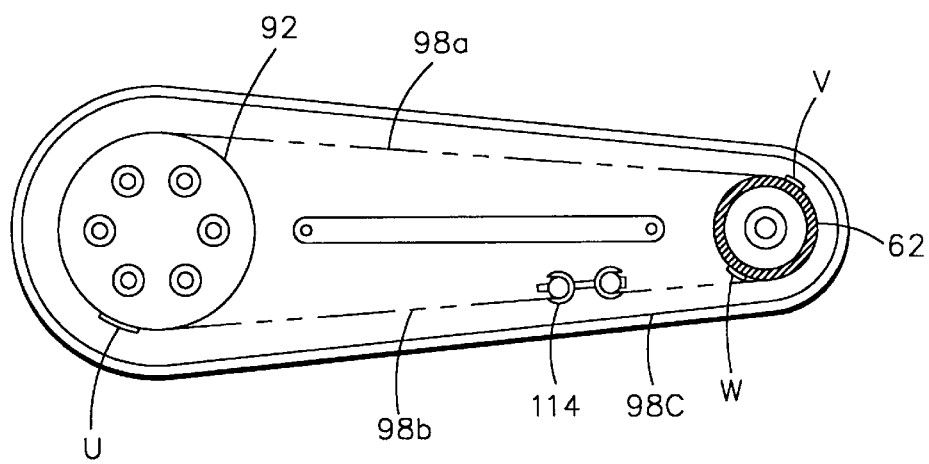
FIG. 10 is a plan view of the rotary coupling connection.
Figure 11:
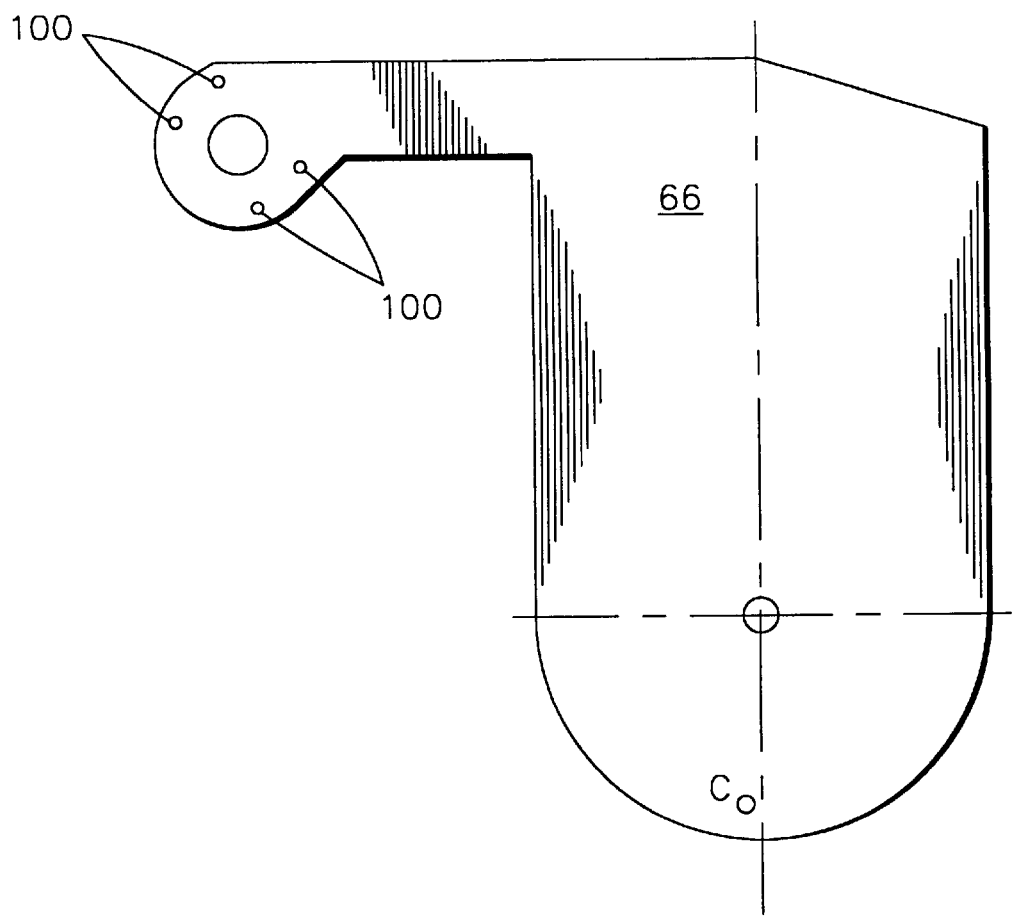
FIG. 11 is a plan view of an end effector.
Figure 12:
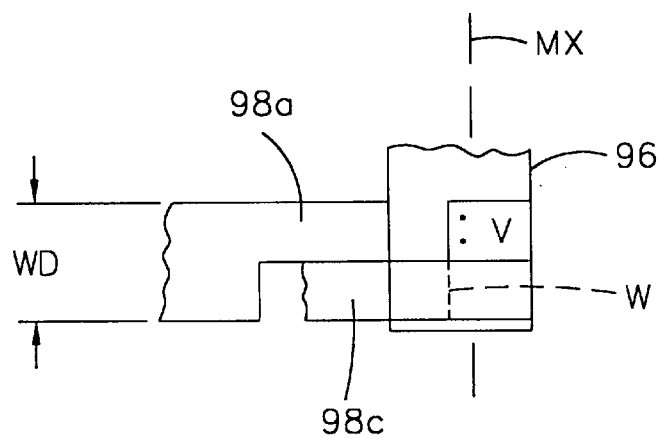
FIG. 12 is a partially fragmentary view of the segmented belt connection at the mounting shaft.

Referring now to FIG. 10, it should be understood that the band 98 is actually fixed to the pulleys 92 and 96 to allow limited rotational movement of the mounting shaft through the arc AR of about 110 degrees. The band 98 is made up of three effective segments as defined by reference numerals 98a, 98b and 98c. The ends of the segment 98a are fixed respectively to the surface of the pulleys 92 and 96 at points U and V respectively One end of segment 98b is also fixed to the base pulley 92 at point U so as to be co-terminal with the segment 98a. One end of the segment 98c is fixed to the surface of the pulley 96 at point W. The remaining free ends of the segments 98b and 98c are connected to one another by a tensioner 114. The use of a sheet metal band having a width WD of considerable dimension is beneficial for the purpose increasing stiffness. Also, the use of a sheet metal band of a thickness, for example of 1", allows for the band to be cut half way across its width and still maintain its stiffness. This is particularly useful in the case of the segments 98a and 98c, where the end lengths thereof, as shown in FIG. 12, are cut in half so that each length having a cut width is positioned side by side with the other and shares a portion of the surface of the driven pulley 96 and effects anchoring at different angular positions thereon.

Figure 7:
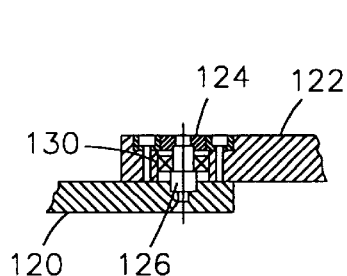
Figure 8:
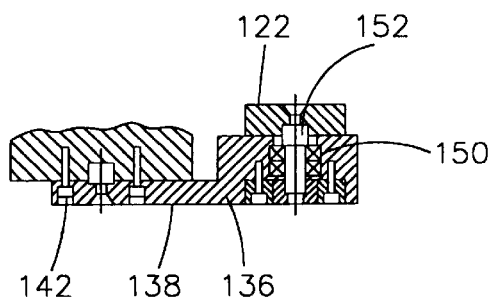
FIG. 8 is sectional view taken along line 8—8 in FIG. 6b.
Figure 9:
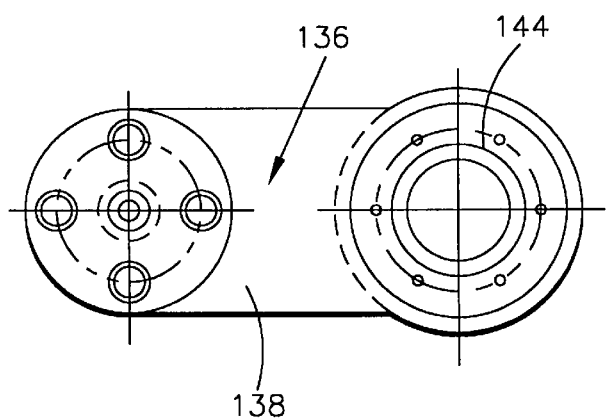
FIG. 9 is a plan view of the link element.

Referring now to FIGS. 6a, 6b and 7–10, it should be seen that the articulated linkage 70 is comprised of a minor arm 120 and a major arm 122 which are pivotally connected to one another at a pivot joint 124 which includes a pin 126 oriented parallel to the indicated Z-axis and journalled within a bearing race 130 fitted within the juxtaposed end of the major arm 122 as seen in FIG. 7. The end of the minor arm 120 which is associated with the rotary shaft 56 as illustrated in FIG. 5 has a frustoconical clamping collar 132 which engages on a correspondingly shaped surface formed at the top end of the rotary shaft 56. A securement bolt 134 is provided and when tightened, nonrotatably secures the shaft 56 to the minor arm 120. As illustrated in FIGS. 5, 8 and 9, the end of the major arm 122 which is associated with the drive arm 60 pivotally connects to the drive arm through the intermediary of a link element 136. The element 136 has a mounting portion 138 which is adapted to be secured against movement to the undersurface 140 (see FIG. 5) of the drive arm 60 by connecting bolts 142 so as to extend perpendicularly thereto. At the other end of the element 136 is provided a journalling opening 144 which receives a bearing assembly 150 fitted therein. The bearing assembly includes a vertically extending pivot pin 152 which has an upwardly extending portion which is connected to the juxtaposed end of the major arm 122. In this way, rotation of the rotary shaft 56 in a clockwise direction will cause the drive arm to sweep in a clockwise direction and rotation of the rotary shaft 56 in a counterclockwise direction will cause the drive arm to sweep in a counterclockwise direction.

In operation, the transport apparatus 36 is capable of moving the center(s) C of the plurality of stacked substrates 25 (or even a single substrate) along a pure straight linear path as illustrated by the positions A–B in FIG. 6a and 6b. The locations A–B are connected by the linear straight line LL which identifies the path followed by the substrate S as between the cassette 26 (location A) and the internal confines of the load lock 32 (location B).

By following the movement of the axis MX, the articulation of the drive arm 60 relative to the end effector plurality 64 may be understood. In the retracted condition shown in FIG. 6a, the axis MX is located at point 117 corresponding to where the end effector plurality 64 is housed within the load lock 32 in the illustrated manner. By rotating rotary shaft 56 clockwise, the drive arm 60 is caused to swing in a clockwise direction to the position illustrated in FIG. 6b where the axis MX is moved through the arc AR to the position denoted as 118.

In so pivoting the drive arm 60 from locations 117 to 118, the effect on the end effectors 66 is that the mounting shaft 62 is rotated in an opposite clockwise direction CW. Since the diameter of the primary pulley 92 is on the order of twice that of the second pulley 96, the translation of the rotary movement to the end effectors 66,66 causes the center C of the substrate 25 to be moved along a straight line path LL to the extended position illustrated by the location numbered 118. Throughout the rotation of the drive arm 60 in the clockwise direction, a corresponding opposite rotation is effected at the mounting shaft 62 and at a value of twice the rotation of the drive arm 60. In this way, the center C of the substrate S, while being rotated, is nevertheless moved in a linear path along the line of action LL.

The retraction of the drive arm and end effector plurality from the 118 position to the 117 position is accomplished through the reverse of the aforesaid process whereby the rotary shaft 56 is caused to be rotated in a counterclockwise direction to affect the retraction of the drive arm back to the location designated by the numeral 101.

It should also be appreciated that the use of a stacked arrangement of end effectors 66,66 allows the system to use the transfer apparatus 36 as a platform on which subsequent operations can be performed on the substrates carried thereby in a one-by-one manner at the station 38. That is, in the past it was required that an entire cassette be moved from point A in FIG. 3 to point B, and then to rely upon either a tool in the station 38 to move vertically between the various shelves in the cassette, or to move the cassette vertically relative to the station 38 in order to work on the substrates S in a one by one manner for subsequent operation. By the present invention however, the step of moving the cassette 26 from point A to point B is eliminated, with the result being greater throughput and efficiency of use.

By the foregoing an improved transport apparatus has been described by way of a preferred embodiments. However numerous modifications and substitutions without departing from the spirit of the invention. In particular, the invention is described with reference to counterclockwise/clockwise, vertical, horizontal and other angular labelling. However, such labels are used only for purposes of explanation, and are not to be taken to limit the scope of the invention to these orientations. Also, the transfer device is usable to handle other substrates, such as the test substrates 130, which may be located in the chamber 30.

Accordingly, the invention has been described by way of illustration rather than limitation.

What is claimed is:

1. An apparatus comprising:

a base and a drive arm pivotally connected to one another about a first pivot axis;

a drive means connected to said drive arm for moving said drive arm through an arc about said first pivot axis;

said drive arm having a free end which has a second pivot axis disposed parallel to the first pivot axis;

said drive arm free end further including at least one article handling element which is rotatably disposed about said second pivot axis, said at least one article handling element having a center on which a substrate is supported; and means for rotatably coupling said at least one article handling element to said base such that upon movement of said drive arm through said arc in a first rotary direction said at least one article handling element is rotated about said second pivot axis in the other opposite direction to move said center of said at least one article handling element along a straight line path and to angularly rotate said at least one article handling element relative to said straight line path as said at least one article handling element is rotated about said second pivot axis; and wherein said means for rotatably coupling said at least one article handling element to said base includes a driven pulley disposed on said free end of said drive arm and in line with a primary pulley mounted against movement to said base and connected through the intermediary of a belt loop to said primary pulley, and said belt loop being comprised of a belt comprised of a plurality of sections, at least two sections having a reduced width effecting shared connection about the driven pulley at different angular locations.

2. A batchloader comprising:

a base secured against movement to a vertically movable support stand which houses a vertically oriented rotary shaft therewithin;

a drive arm pivotally mounted to said base at one end thereof and connected to said rotary shaft for rotation about a first axis of rotation;

said drive arm having another end mounting a plurality of end effectors in a stacked arrangement for rotation about a second rotational axis, each of said plurality of end effectors having a center for supporting a substrate thereon;

said plurality of end effectors being rotatably connected to said base by a rotatable coupling means including a primary pulley fixed to said base and by a metal belt which loops thereabout such that swinging of said drive arm in one rotational direction causes a counter direction rotation of said plurality of end effectors such that said centers of said plurality of end effectors moves along a straight line path and said plurality of end effectors simultaneously rotate with one another relative to said straight line path as said plurality of end effectors are rotated about said second pivot axis; and wherein said means for rotatably coupling said at least one article handling element to said base includes a driven pulley disposed on said free end of said drive arm and in line with said primary pulley and connected by said belt, and said belt being comprised of a plurality of sections, at least two sections having a reduced width effecting shared connection about the driven pulley at different angular locations.

* * * * *